(12) United States Patent
Corisis et al.

(10) Patent No.: US 7,084,514 B2
(45) Date of Patent: Aug. 1, 2006

(54) MULTI-CHIP MODULE AND METHODS

(75) Inventors: David J. Corisis, Meridian, ID (US); Jerry M. Brooks, Caldwell, ID (US); Matt E. Schwab, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/058,984

(22) Filed: Feb. 16, 2005

(65) Prior Publication Data

US 2005/0146009 A1 Jul. 7, 2005

Related U.S. Application Data

(63) Continuation of application No. 10/118,401, filed on Apr. 8, 2002, now Pat. No. 6,867,500.

(51) Int. Cl.
*H01L 23/48* (2006.01)
*H01L 23/52* (2006.01)

(52) U.S. Cl. .................. 257/777; 257/780; 257/781; 257/784; 438/108; 438/109; 438/110

(58) Field of Classification Search ................ 257/777, 257/780, 781, 784; 438/108, 109, 110
See application file for complete search history.

(56) References Cited

U.S. PATENT DOCUMENTS

| | | | |
|---|---|---|---|
| 5,323,060 A | 6/1994 | Fogal et al. | |
| 5,646,828 A | 7/1997 | Degani et al. | |
| 5,994,166 A | 11/1999 | Akram et al. | |
| 6,051,886 A | 4/2000 | Fogal et al. | |
| 6,084,308 A | 7/2000 | Kelkar et al. | |
| 6,212,767 B1 | 4/2001 | Tandy | |
| 6,239,484 B1 | 5/2001 | Dore et al. | |
| 6,337,226 B1 | 1/2002 | Symons | |
| 6,353,263 B1 | 3/2002 | Dotta et al. | |
| 6,376,904 B1 | 4/2002 | Haba et al. | |
| 6,414,381 B1 | 7/2002 | Takeda | |
| 6,525,413 B1 | 2/2003 | Cloud et al. | |
| 6,558,978 B1 | 5/2003 | McCormick | |
| 6,569,709 B1 * | 5/2003 | Derderian | ................ 438/109 |
| 6,600,221 B1 | 7/2003 | Kimura | |
| 6,657,290 B1 | 12/2003 | Fukui et al. | |
| 6,847,105 B1 | 1/2005 | Koopmans | |
| 2003/0189257 A1 | 10/2003 | Corisis et al. | |

FOREIGN PATENT DOCUMENTS

JP 57-31166 * 2/1982 ................ 257/686

(Continued)

*Primary Examiner*—Jasmine Clark
(74) *Attorney, Agent, or Firm*—TraskBritt

(57) ABSTRACT

A substrate includes first and second regions over which first and second semiconductor devices are to be respectively positioned. The first region is located at least partially within the second region. Contact areas are located external to the first region but within the second region. In one embodiment, in which semiconductor devices are to be stacked over and secured to the substrate in a flip-chip type arrangement, the contact areas correspond to bond pads of an upper, second semiconductor device, while other contact areas located within the first region correspond to bond pads of a lower, first semiconductor device. In another embodiment, the contact areas correspond to bond pads of the first semiconductor device, which are electrically connected thereto by way of laterally extending discrete conductive elements, while other contact areas that are located external to the second region correspond to bond pads of the upper, second semiconductor device.

22 Claims, 2 Drawing Sheets

FOREIGN PATENT DOCUMENTS

| | | |
|---|---|---|
| JP | 62-261166 | 11/1987 |
| JP | 63-128736 | 6/1988 |

* cited by examiner

MULTI-CHIP MODULE AND METHODS

CROSS-REFERENCE TO RELATED APPLICATION

This application is a continuation of application Ser. No. 10/118,401, filed Apr. 8, 2002, now U.S. Pat. No. 6,867,500, issued Mar. 15, 2005.

BACKGROUND OF THE INVENTION

1. Field of the Invention

The present invention relates generally to multi-chip modules including semiconductor devices in stacked arrangement and, more specifically, to stacked multi-chip modules including at least one semiconductor device that is superimposed over contact areas on a substrate over which an underlying semiconductor device is not superimposed, with one of the stacked semiconductor devices being electrically connected to the contact areas. The present invention also relates to substrates for use in multi-chip modules that include stacked semiconductor devices, which substrates include contact areas located between the outer peripheries of regions over which semiconductor devices are to be positioned in adjacent, stacked arrangement.

2. Background of Related Art

In order to conserve the amount of surface area, or "real estate," consumed on a carrier substrate, such as a circuit board, by semiconductor devices connected thereto, various types of increased density packages have been developed. Among these various types of packages is the so-called "multi-chip module" (MCM). Some types of multi-chip modules include assemblies of semiconductor devices that are stacked one on top of another. The amount of surface area on a carrier substrate that may be saved by stacking semiconductor devices is readily apparent-a stack of semiconductor devices consumes roughly the same amount of real estate on a carrier substrate as a single, horizontally oriented semiconductor device or semiconductor device package.

Due to the disparity in processes that are used to form different types of semiconductor devices (e.g., the number and order of various process steps), the incorporation of different types of functionality into a single semiconductor device has proven very difficult to actually reduce to practice. Even in cases where semiconductor devices that carry out multiple functions can be fabricated, multi-chip modules that include semiconductor devices with differing functions (e.g., memory, processing capabilities, etc.) are often much more desirable since the separate semiconductor devices may be fabricated independently and later assembled with one another much more quickly and cost-effectively (e.g., lower production costs due to higher volumes and lower failure rates).

Multi-chip modules may also contain a number of semiconductor devices that perform the same function, effectively combining the functionality of all of the semiconductor devices thereof into a single package.

An example of a conventional, stacked multi-chip module includes a carrier substrate, a first, larger semiconductor device secured to the carrier substrate, and a second, smaller semiconductor device positioned over and secured to the first semiconductor device. Any suitable adhesive may be used to secure the semiconductor devices to one another. The second semiconductor device does not overlie bond pads of the first semiconductor device and, thus, the second semiconductor device does not cover bond wires that electrically connect bond pads of the first semiconductor device to corresponding contacts or terminal pads of the carrier substrate. To facilitate the connection of bond wires between bond pads and their corresponding contact pads, each of the contact pads of the carrier substrate is positioned beyond an outer periphery of the lowermost of the stacked semiconductor devices. Such a multi-chip module is disclosed and illustrated in U.S. Pat. No. 6,212,767, issued to Tandy on Apr. 10, 2001 (hereinafter "the '767 patent").

U.S. Pat. No. 5,323,060, issued to Fogal et al. on Jun. 21, 1994 (hereinafter "the '060 patent") shows one example where dice of the same size are stacked on top of one another over a circuit board. Bonding wires are connected from the bond pads of each die to corresponding terminal pads on the circuit board. Each of the terminal pads is located beyond the outer peripheries of the stacked dice.

Stacked multi-chip modules of other configurations have also been developed. For example, it is known that stacked multi-chip modules may include large semiconductor devices positioned over smaller semiconductor devices and that adjacent semiconductor devices may be staggered relative to one another or have different orientations.

Different electrical connection technologies, including wire bonding, tape-automated bonding ("TAB"), and controlled-collapse chip connection ("C-4"), which results in a so-called flip-chip arrangement, are but a few of the ways in which discrete conductive elements may be formed in stacked multi-chip modules. Different electrical connection technologies have also been used in single multi-chip modules, with the bond pads of one semiconductor device being electrically connected to corresponding contact areas of a substrate of the multi-chip module with a different type of discrete conductive element than that used to form electrical connections between the bond pads of another semiconductor device and their corresponding contact areas of the substrate.

Stacked multi-chip modules in which bond pads of the semiconductor devices are electrically connected to corresponding contact areas of a substrate by way of discrete conductive elements that extend laterally over a periphery of the semiconductor device to which they are connected, such as bond wires or conductive TAB elements carried upon a dielectric film, typically include substrates with contact areas that are positioned outside the peripheries of all of the stacked semiconductor devices thereof. To avoid routing congestion of the contact areas and terminals, the substrates of such stacked multi-chip modules must be routed using advance layout rules. Due to the amount of surface area, or "real estate" of the substrate consumed by these contact areas and their corresponding conductive traces, the size of the substrate may be undesirably large, extending well beyond the outer periphery of the largest semiconductor device thereof. The inability to reduce the minimum area around the outer periphery of the largest die of a stacked multi-chip module prevents the design and manufacture of multi-chip modules of ever-decreasing dimensions.

When flip-chip type connections are used to connect a semiconductor device of a stacked multi-chip module to either another semiconductor device of the multi-chip module or the substrate thereof, the bond pads of at least one of the other semiconductor devices of the multi-chip module are typically connected to corresponding contact areas of the substrate by way of laterally extending discrete conductive elements. Consequently, at least some of the contact areas of the substrate must be located beyond an outer periphery of the semiconductor device that includes bond pads that correspond to these contact areas. As a result, a considerable amount of the real estate of such a substrate does not carry the contact areas or conductive elements that correspond to the bond pads of the semiconductor devices, making the substrate undesirably large.

Accordingly, there are needs in the art for substrates for use in stacked multi-chip modules and having smaller dimensions and for stacked semiconductor device assemblies that include such compact substrates.

SUMMARY OF THE INVENTION

The present invention includes a multi-chip module including a substrate and two or more semiconductor devices secured to the substrate and arranged in stacked relation relative to one another. A first of the semiconductor devices is secured to the substrate with a first set of contact areas of the substrate that correspond to bond pads of the first semiconductor device located adjacent to an outer periphery of the first semiconductor device. An immediately overlying, second semiconductor device includes at least a portion thereof that extends over an outer periphery of a corresponding portion of the underlying, first semiconductor device such that a corresponding portion of the outer periphery of the second semiconductor device is located laterally beyond the outer periphery of the first semiconductor device. Accordingly, the second semiconductor device overlies at least some of the contact areas of the first set. By way of example only, the second semiconductor device may consume a greater amount of real estate than the first semiconductor device. A second set of contact areas of the substrate, which corresponds to bond pads of the second semiconductor device, is positioned laterally beyond an outer periphery of the second semiconductor device to facilitate placement of laterally extending intermediate conductive elements between the bond pads of the second semiconductor device and corresponding contact areas of the second set.

The present invention also includes substrates, such as circuit boards, interposers, other semiconductor devices, and leads that include contact areas positioned laterally between the location of an outer periphery of a first semiconductor device that includes bond pads that correspond to positions at which the contact areas will be located upon positioning the first semiconductor device relative to the substrate and location that an outer periphery of a second semiconductor device to be positioned over the first semiconductor device will be located. In addition, the substrate may include a second set of contact areas that is positioned outside an outer periphery of a second semiconductor device upon positioning the second semiconductor device over the first semiconductor device.

Another embodiment of substrate may include a first set of contact areas arranged so as to mirror the positions of corresponding bond pads of a first semiconductor device to be flip chip attached to the substrate. In addition, the substrate includes a second set of contact areas positioned outside a location where the outer periphery of the first semiconductor device will be positioned upon assembly of the first semiconductor device with the substrate and a location where the outer periphery of the second semiconductor device will be positioned upon assembling the second semiconductor device over the first semiconductor device. As with the first set of contact areas, the second set of contact areas is arranged to mirror corresponding bond pads of the second semiconductor device and, thus, to facilitate flip chip attachment of the second semiconductor device to the substrate.

The present invention also includes methods for designing substrates incorporating teachings of the present invention, as well as methods for forming semiconductor device assemblies and methods for packaging assemblies incorporating teachings of the present invention.

Other features and advantages of the present invention will become apparent to those of ordinary skill in the art through consideration of the ensuing description, the accompanying drawings, and the appended claims.

BRIEF DESCRIPTION OF THE SEVERAL VIEWS OF THE DRAWINGS

In the drawings, which illustrate exemplary embodiments of various aspects of the present invention.

DETAILED DESCRIPTION OF THE INVENTION

Figure 1:
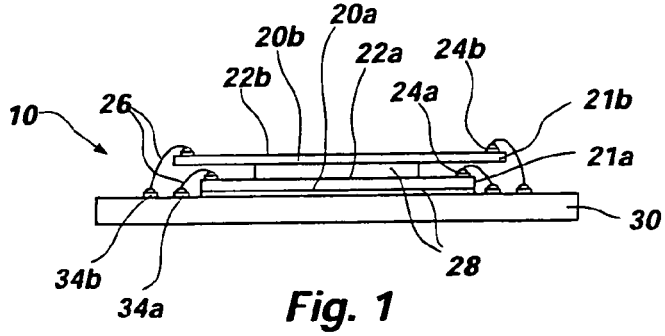
FIG. 1 is a side view of an exemplary embodiment of stacked semiconductor device assembly incorporating teachings of the present invention.

With reference to FIG. 1, an exemplary embodiment of multi-chip module 10 is depicted. Multi-chip module 10 includes two semiconductor devices 20a and 20b in stacked, or at least partially superimposed, relation to one another, as well as a substrate 30 over which semiconductor devices 20a and 20b are positioned. Semiconductor devices 20a and 20b are both positioned with active surfaces 22a, 22b thereof facing away from substrate 30.

Semiconductor devices 20a and 20b may be any type of device suitable for use in a multi-chip module, including user-programmable or nonprogrammable memory devices (e.g., DRAM, SRAM, PROM, EEPROM, etc.), processors, or other types of semiconductor devices, including semiconductor devices that have both memory and processing capabilities. While it is preferred that semiconductor devices 20a and 20b include bond pads 24a, 24b, respectively, located on active surfaces 22a, 22b adjacent to the respective outer peripheries 21a, 21b thereof, packaged and substantially bare semiconductor devices that include rerouted, centrally located bond pads are also within the scope of the present invention.

While substrate 30 is depicted as being a circuit board, which includes contact areas 34a, 34b in the form of terminal pads, as well as corresponding conductive traces (not shown), any suitable type of carrier may be employed as substrate 30. By way of example and not to limit the scope of the present invention, interposers, other semiconductor devices, leads, and the like may alternatively be employed as substrate 30.

Figure 2:
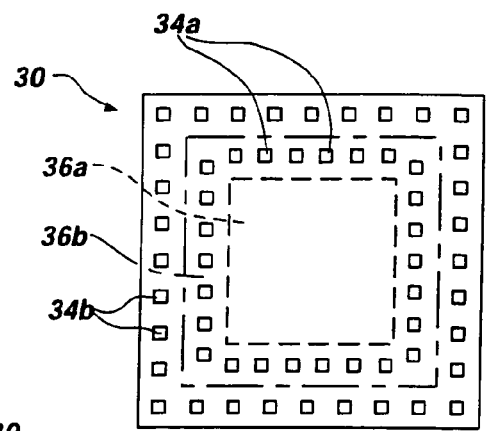
FIG. 2 is a top view of the substrate of the semiconductor device assembly shown in FIG. 1.

The lower semiconductor device 20a of multi-chip module 10 at least partially underlies the next-higher semiconductor device 20b with a portion of semiconductor device 20b overlying at least a portion of outer periphery 21a of semiconductor device 20a and with a portion of outer periphery 21b of the next-higher semiconductor device 20b being located laterally beyond a corresponding portion of outer periphery 21a of semiconductor device 20a. For example, semiconductor device 20a may be smaller than the next-higher semiconductor device 20b and fully covered thereby. As such, semiconductor device 20a is superimposed over a smaller amount of real estate, or surface area, of substrate 30 than that over which semiconductor device 20b lies. This is best seen in FIG. 2, which shows a first region 36a of substrate 30 over which the lower semiconductor device 20a is positioned or is to be positioned, as well as a second region 36b of substrate 30 over which the next-higher semiconductor device 20b is positioned or is to be positioned. While first region 36a is illustrated as being located completely within second region 36b, substrates that include first regions that are located only partially within second regions thereof are also within the scope of the present invention.

Multi-chip module 10 also includes intermediate conductive elements 26 that electrically connect bond pads 24a of the lower semiconductor device 20a to corresponding contact areas 34a of substrate 30 and bond pads 24b of the next-higher semiconductor device 20b to corresponding contact areas 34b of substrate 30. Intermediate conductive elements 26 of multi-chip module 10 may, by way of example, comprise the depicted bond wires, TAB elements comprising conductive traces carried upon a dielectric film, bonded leads (e.g., by thermocompression techniques, ultrasonic techniques, use of solder or a conductive adhesive, such as conductive or conductor-filled epoxy, an anisotropically conductive elastomer, etc.), or the like.

As intermediate conductive elements 26 of multi-chip module 10 are laterally extending structures and since the lower semiconductor device 20a is superimposed over a smaller first region 36a of substrate 30 than second region 36b over which the next-higher semiconductor device 20b is to be positioned, contact areas 34a that correspond to bond pads 24a of semiconductor device 20a may be located external to first region 36a but within second region 36b. Thus, in multi-chip module 10, contact areas 34a are located laterally between an outer periphery 21a of semiconductor device 20a and an outer periphery 21b of semiconductor device 20b. Contact areas 34b of substrate 30 that correspond to bond pads 24b of semiconductor device 20b are, of course, located laterally external to outer periphery 21b of semiconductor device 20b and, thus, external to second region 36b of substrate 30.

Due to the inclusion of contact areas 34a and portions of corresponding conductive traces (not shown) between first region 36a and second region 36b of substrate 30, a smaller area is required to carry contact areas 34a, 34b and their corresponding conductive traces, facilitating a reduction in the size of substrate 30 relative to the sizes of the substrates used in comparable conventional stacked multi-chip modules.

Figure 3:
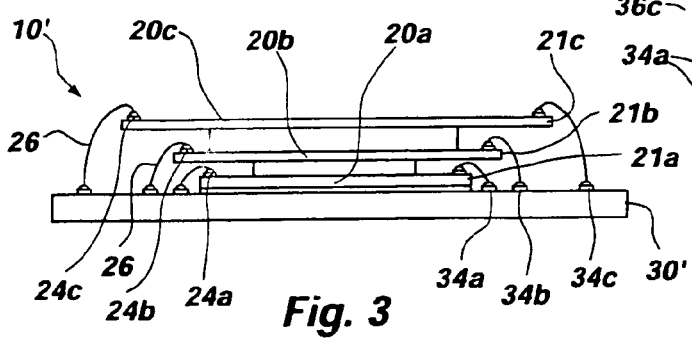
FIG. 3 is a side view of another exemplary embodiment of stacked semiconductor device assembly incorporating teachings of the present invention.

FIG. 3 depicts a multi-chip module 10' that includes components that are configured similarly to the components of multi-chip module 10 (FIG. 1), but which also includes an additional semiconductor device 20c positioned over semiconductor device 20b. As depicted, semiconductor device 20c is larger than the next-lower semiconductor device 20b and, thus, has a larger footprint than semiconductor device 20b.

Figure 4:
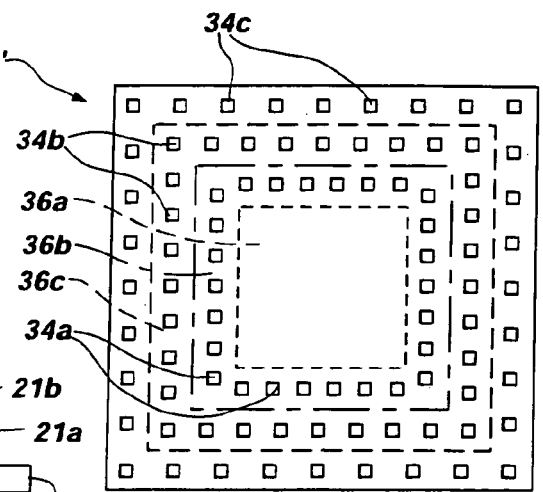
FIG. 4 is a top view of the substrate of the semiconductor device assembly shown in FIG. 3.

To accommodate semiconductor device 20c and to facilitate electrical connection thereto, a substrate 30' of multi-chip module 10' is somewhat larger than substrate 30 (FIGS. 1 and 2) of multi-chip module 10. As shown in FIG. 4, substrate 30' includes a first region 36a over which a first semiconductor device 20a is positioned or is to be positioned, a larger second region 36b over which a next-higher, second semiconductor device 20b is positioned or is to be positioned, and an even larger third region 36c over which the next-higher semiconductor device 20c is positioned or is to be positioned. In addition to including contact areas 34a external to first region 36a and within second region 36b, contact areas 36b of substrate 30' are located within third region 36c, but external to second region 36b. Substrate 30' also includes another set of contact areas 34c, which correspond to bond pads 24c of semiconductor device 20c. When substrate 30' is used in a multi-chip module 10', as depicted in FIG. 3, contact areas 34b are located laterally between an outer periphery 21b of semiconductor device 20b and an outer periphery 21c of the next-higher semiconductor device 20c, while contact areas 34c are located on substrate 30' laterally beyond outer periphery 21c of semiconductor device 20c.

Again, intermediate conductive elements 26 may electrically connect bond pads 24a, 24b, 24c with corresponding contact areas 34a, 34b, 34c, respectively, to establish electrical communication therebetween.

Figure 5:
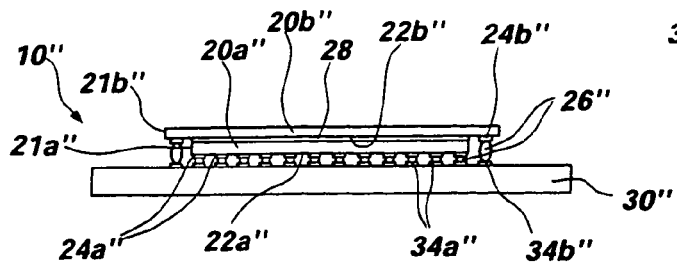
FIG. 5 is a side view of a flip-chip embodiment of stacked semiconductor device assembly incorporating teachings of the present invention.

Turning now to FIG. 5, another embodiment of multi-chip module 10" is illustrated. Multi-chip module 10" includes two semiconductor devices 20a" and 20b" superimposed with respect to one another in stacked arrangement. Although semiconductor device 20b" is depicted as being larger than the immediately underlying semiconductor device 20a", semiconductor device 20b" need only overlie semiconductor device 20a" in such a manner that semiconductor device 20b" overlie a portion of outer periphery 21a" of semiconductor device 20a" and that at least a portion of outer periphery 21b" of semiconductor device 20b" be located laterally beyond a corresponding portion of outer periphery 21a". Both semiconductor device 20a" and semiconductor device 20b" are positioned over a substrate 30" with active surfaces 22a" and 22b" facing substrate 30". Accordingly, bond pads 24a", 24b" of semiconductor devices 20a" and 20b", respectively, may be electrically connected to corresponding, respective contact areas 34a", 34b" of substrate 30" by way of discrete conductive elements 26" in the form of balls, bumps, columns, pillars, pins, or the like formed from conductive material (e.g., metal, metal alloy, conductive or conductor-filled epoxy, anisotropically conductive elastomer, etc.) in a so-called "flip-chip" type arrangement.

Figure 6:
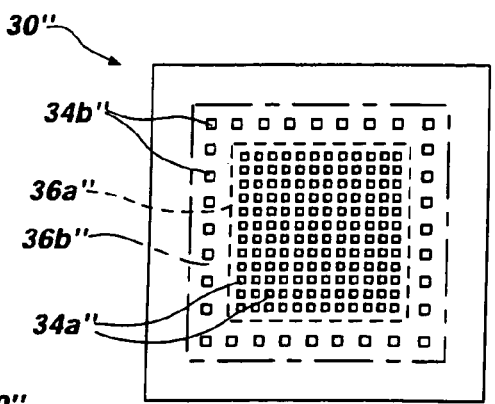
FIG. 6 is a top view of the substrate of the semiconductor device assembly of FIG. 5.

FIG. 6 depicts substrate 30", which includes a first region 36a" over which the lowermost semiconductor device 20a" of multi-chip module 10" is positioned or is to be positioned, as well as a second region 36b" over which the next-higher semiconductor device 20b" is positioned or is to be positioned. As shown, first region 36a" is smaller than and located completely within second region 36b", although substrates that include first regions that are only partially located within second regions thereof are also within the scope of the present invention.

Substrate 30" includes contact areas 34a", 34b" which correspond to bond pads 24a", 24b" of semiconductor devices 20a" and 20b", respectively. As semiconductor devices 20a" and 20b" are disposed over substrate 30" in a flip-chip type arrangement, the arrangements of contact areas 34a", 34b" on substrate 30" may mirror the respective arrangements of bond pads 24a", 24b" on active surfaces 22a", 22b" of semiconductor devices 20a", 20b".

Each contact area 34a" that corresponds to a bond pad 24a" of semiconductor device 20a" is located within first region 36a", while each contact area 34b" that corresponds to a bond pad 24b" of semiconductor device 20b" is located in a portion of second region 36b" that is not overlapped by (i.e., is exterior to) first region 36a". Accordingly, as depicted in FIG. 5, in multi-chip module 10", contact areas 34b" of substrate 30" and bond pads 24b" of an upper semiconductor device 20b" are located laterally between outer periphery 21b" of semiconductor device 20b" and outer periphery 21a" of the next-lower semiconductor device 20a". Consequently, discrete conductive elements 26" that extend between and, thus, electrically connect bond pads 24b" and corresponding contact areas 34b" are positioned laterally beyond outer periphery 21a" of the lowermost semiconductor device 20a", while discrete conductive elements 26" that extend between and electrically connect bond pads 24a" and corresponding contact areas 34a" are located beneath semiconductor device 20a".

An exemplary method for designing substrates 30, 30', and 30" includes configuring a substrate 30, 30', 30" to include at least a first region 36a, 36a" and a second region 36b, 36b", which encompasses at least a portion of first region 36a, 36a", over which different semiconductor devices are to be positioned. In so configuring first region 36a, 36a" and second region 36b, 36b", at least a portion of an outer periphery of first region 36a, 36a" is located within the confines of and laterally spaced apart from an adjacent, corresponding portion of an outer periphery of second region 36b, 36b".

At least a first set of contact areas 34a, 34a" and a second set of contact areas 34b, 34b" (collectively referred to hereinafter as contact areas 34) and conductive traces corresponding to the contact areas are also configured. At least one of the sets of contact areas 34 is located within second region 36b, 36b" and between an outer periphery of first region 36a, 36a" and at least one corresponding, adjacent portion of an outer periphery of second region 36b, 36b". In designing substrates 30 and 30', contact areas 34a are configured to be located between an outer periphery of first region 36a and one or more adjacent portions of the outer periphery of second region 36b. In the design of substrate 30", contact areas 34b" are configured to be located between one or more adjacent portions of the outer peripheries of first region 36a" and second region 36b".

Conventional fabrication processes may be used to form substrates that incorporate teachings of the present invention. Of course, the process by which a substrate is fabricated depends upon the type of substrate to be used in a multi-chip module incorporating teachings of the present invention.

Conventional techniques may likewise be used to fabricate multi-chip modules 10, 10', 10". By way of example only, and returning reference to FIG. 1, semiconductor device 20a may be positioned over and secured to a carrier substrate 30 therefor. A quantity of an adhesive material 28 (e.g., pressure sensitive adhesive, curable adhesive, thermoplastic material, adhesive-coated dielectric element, etc.) may be applied to appropriate regions of semiconductor device 20a, substrate 30, or both by known application techniques, such as spray-on, roller coating, needle dispense, screen printing, positioning of adhesive-coated elements, or other suitable processes. The positioning of semiconductor device 20a on substrate 30 may be effected by way of pick and place die attach equipment, as known in the art. If necessary, adhesive material 28 may also be cured by known processes (e.g., heat or snap curing, exposure to one or more curing wavelengths of radiation, exposure to a catalyst, etc.) that are suitable for the type of adhesive material 28 employed.

Bond pads 24a of semiconductor device 20a may be electrically connected to corresponding contact areas 34a of substrate 30 by forming or positioning intermediate conductive elements 26 therebetween. By way of example only, known wire bonding, thermocompression bonding, ultrasonic bonding, TAB, and other processes may be used to form or position intermediate conductive elements 26.

A second semiconductor device 20b may be positioned over and secured to the first semiconductor device 20a, with at least a portion of semiconductor device 20b extending over an outer periphery 21a of the underlying semiconductor device 20a and at least a portion of an outer periphery 21b of semiconductor device 20b being located laterally beyond a corresponding portion of outer periphery 21a of the underlying semiconductor device 20a. Such positioning and securing may, by way of example only, be effected in a similar manner as that described previously herein with respect to the positioning of semiconductor device 20a over and the securing of the same to substrate 30.

Bond pads 24b of second semiconductor device 20b may be electrically connected to corresponding contact areas 34b of substrate 30 by forming or positioning intermediate conductive elements 26 between each corresponding pair of bond pads 24b and contact areas 34b, as described previously herein with respect to the connection of bond pads 24a and contact areas 34a.

When substrate 30' of FIG. 4 is used, additional semiconductor devices 20c, etc. may be added thereto, as described herein, to form a multi-chip module 10', such as that depicted in FIG. 3.

Referring again to FIG. 5, in fabricating a flip-chip type multi-chip module 10", discrete conductive elements 26" may be secured to one or both of bond pads 24a" of semiconductor device 20a" and contact areas 34a" of substrate 30". Semiconductor device 20a" may be positioned over substrate 30" with corresponding bond pads 24a" and contact areas 34a" in alignment. Known techniques, such as solder reflow, pin insertion, adhesive bonding, and others, may be used to electrically connect bond pads 24a" of semiconductor device 20a" to their corresponding contact areas 34a" of substrate 30", as well as to secure semiconductor device 20a" to substrate 30". A dielectric adhesive material 28, such as a suitable underfill material, may be used between semiconductor device 20a" and substrate 30" to further secure semiconductor device 20a" to substrate 30".

Semiconductor device 20b" may similarly be positioned and secured over semiconductor device 20a" and to substrate 30". Of course, bond pads 24b" of semiconductor device 20b", which are in substantial alignment with corresponding contact areas 34b" of substrate 30", are electrically connected to their corresponding contact areas 34b". A quantity of adhesive material 28, such as an underfill material, a thin, planar adhesive-coated element, or the like, may be disposed between adjacent surfaces of semiconductor devices 20a" and 20b" to secure semiconductor devices 20a" and 20b" to one another.

Figure 7:
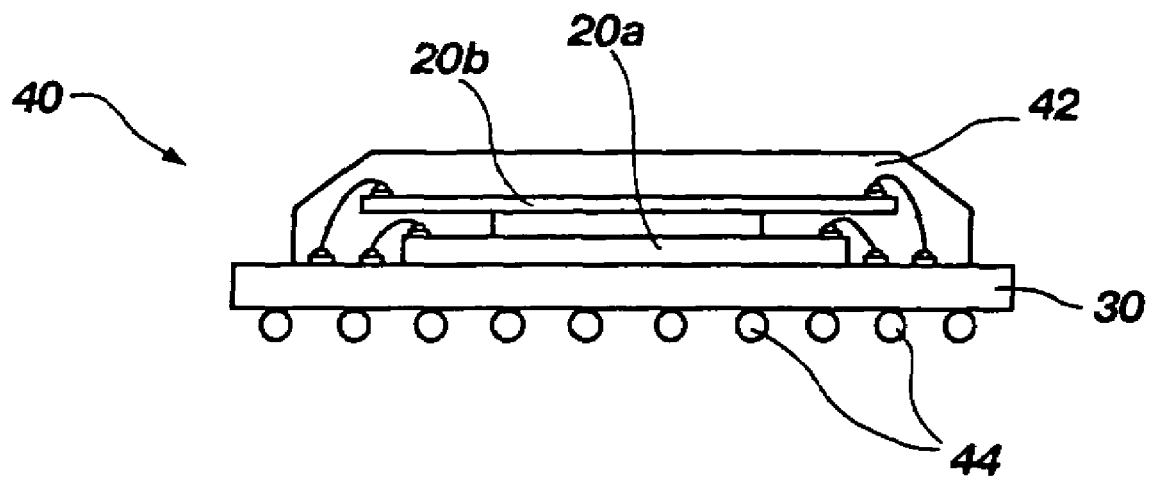
FIG. 7 is a side view of a semiconductor device package including a stacked semiconductor device assembly.

Turning now to FIG. 7, at least portions of a multi-chip module (e.g., multi-chip modules 10, 10', 10") incorporating teachings of the present invention may be encapsulated, or packaged, as known in the art, to form a semiconductor device package 40. By way of example, a protective encapsulant 42 of semiconductor device package 40 may be formed by glob top encapsulation techniques employing suitable viscous or gel-like encapsulant materials, by pot molding with a suitable epoxy, or as a transfer molded package with a filled or thermoplastic material. Semiconductor device package 40 also includes external conductive elements 44, which communicate with corresponding contact areas 34*a*, 34*b*, etc. (FIGS. 1 and 2) of substrate 30 and, thus, with corresponding bond pads 24*a*, 24*b*, etc. (FIG. 1) of semiconductor devices 20*a*, 20*b*, etc., respectively. By way of example only, external conductive elements 44 may comprise the depicted solder balls, conductive pins, conductive plug-in elements, conductive or conductor-filled epoxy pillars, anisotropically conductive adhesive, or any other conductive structures that are suitable for interconnecting semiconductor device package 40 with other, external electronic componentry.

While certain representative embodiments and details have been shown for purposes of illustrating the invention, it will be apparent to those skilled in the art that various changes in the invention as disclosed herein may be made without departing from the scope of the invention, which is defined in the appended claims.

What is claimed is:

1. A multi-chip module, comprising:
   a substrate;
   a first semiconductor device positioned over a first region of the substrate;
   first intermediate conductive elements extending between bond pads of the first semiconductor device and corresponding first contact areas of the substrate;
   a spacer contacting an active surface of the first semiconductor device;
   a second semiconductor device positioned at least partially over the first semiconductor device, over a second region of the substrate within which at least a portion of the first region is located, and in contact with the spacer;
   second intermediate conductive elements extending between bond pads of the second semiconductor device and corresponding second contact areas of the substrate, third contact areas of the substrate located external to a region of the substrate in which the second contact areas are located.

2. The multi-chip module of claim 1, wherein the first region is located completely within the second region.

3. The multi-chip module of claim 1, wherein the first contact areas are located external to the first region, within the second region.

4. The multi-chip module of claim 3, wherein the first intermediate conductive elements comprise laterally extending intermediate conductive elements.

5. The multi-chip module of claim 1, wherein the first contact areas are located within the first region.

6. The multi-chip module of claim 1, wherein bond pads of the second semiconductor device are in substantial alignment with their corresponding second contact areas.

7. The multi-chip module of claim 1, further comprising: at least one additional semiconductor device positioned over the second semiconductor device.

8. A method for assembling a multi-chip module, comprising:
   positioning a first semiconductor device over a first region of a substrate with an active surface of the first semiconductor device facing away from the substrate;
   placing a spacer in contact with a portion of the active surface of the first semiconductor device;
   positioning a second semiconductor device over a second region of the substrate and at least partially over the first semiconductor device, a surface of the second semiconductor device contacting the spacer, contact areas of the substrate that are not associated with either the first or the second semiconductor device being located laterally beyond an outer periphery of the second semiconductor device; and
   electrically connecting contact areas of the substrate to corresponding bond pads of at least one of the first and second semiconductor devices.

9. The method of claim 8, wherein electrically connecting comprises electrically connecting the contact areas with corresponding bond pads of the first semiconductor device.

10. The method of claim 9, wherein electrically connecting includes positioning or forming laterally extending discrete conductive elements between the contact areas and the corresponding bond pads.

11. The method of claim 8, wherein positioning the second semiconductor device comprises positioning the second semiconductor device with an active surface thereof facing away from the substrate.

12. The method of claim 11, wherein electrically connecting includes electrically connecting bond pads of the second semiconductor device to corresponding contact areas of the substrate located external to the second region.

13. The method of claim 8, wherein positioning the second semiconductor device comprises positioning the second semiconductor device with an active surface thereof facing the spacer, the first semiconductor device, and the substrate.

14. The method of claim 13, wherein electrically connecting includes electrically connecting bond pads of the second semiconductor device to corresponding contact areas of the substrate located within the second region and external to the first region.

15. A method for forming a multi-chip module, comprising:
   positioning a first semiconductor device over a first region of a substantially planar surface of a substrate with an active surface of the first semiconductor device facing the substantially planar surface;
   placing a spacer in contact with a back side of the first semiconductor device; and
   positioning a second semiconductor device over a second region of the substantially planar surface of the substrate and at least partially over the first semiconductor device, a surface of the second semiconductor device contacting the spacer, peripherally located contact areas of the substrate that do not correspond to either the first semiconductor device or the second semiconductor device located laterally beyond a periphery of the second semiconductor device.

16. The method of claim 15, wherein positioning the first semiconductor device comprises aligning bond pads thereof with corresponding first contact areas located within the first region of the substrate.

17. The method of claim 16, further comprising:
   electrically connecting the bond pads of the first semiconductor device to the corresponding first contact areas.

18. The method of claim 17, wherein electrically connecting comprises connecting discrete conductive elements between the bond pads of the first semiconductor device and the corresponding first contact areas.

19. The method of claim 15, wherein positioning the second semiconductor device comprises positioning the second semiconductor device with an active surface thereof facing the substrate.

20. The method of claim 19, wherein positioning the second semiconductor device comprises substantially aligning bond pads of the second semiconductor device with corresponding second contact areas of the substrate.

21. The method of claim 20, wherein electrically connecting comprises connecting discrete conductive elements between the bond pads of the second semiconductor device and the corresponding second contact areas.

22. The method of claim 15, further comprising:

positioning at least one additional semiconductor device over the second semiconductor device and the substrate; and electrically connecting the at least one additional semiconductor device to at least some of the peripherally located contact areas.

* * * * *